US012700985B2

(12) United States Patent
Yu et al.

(10) Patent No.: US 12,700,985 B2
(45) Date of Patent: Aug. 4, 2026

(54) REFERENCE CLOCK SWITCHING IN PHASE-LOCKED LOOP CIRCUITS

(71) Applicant: Apple Inc., Cupertino, CA (US)

(72) Inventors: Hairong Yu, Saratoga, CA (US); Boon-Aik Ang, Los Altos, CA (US); Yu Chen, Santa Clara, CA (US); Litesh Sajnani, Santa Clara, CA (US); Samed Maltabas, Santa Clara, CA (US); Shaobo Liu, Sunnyvale, CA (US); Gregory N. Santos, Melbourne, FL (US); Richard Y. Su, Santa Clara, CA (US); Meei-Ling Chiang, Cupertino, CA (US); Pyoungwon Park, San Jose, CA (US); Dennis M. Fischette, Jr., Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/918,805

(22) Filed: Oct. 17, 2024

(65) Prior Publication Data

US 2025/0192978 A1     Jun. 12, 2025

Related U.S. Application Data

(63) Continuation of application No. 18/152,492, filed on Jan. 10, 2023, now Pat. No. 12,160,497.

(60) Provisional application No. 63/365,434, filed on May 27, 2022.

(51) Int. Cl.
*H04L 7/033* (2006.01)
*H03L 7/093* (2006.01)

(52) U.S. Cl.
CPC ............ *H04L 7/0337* (2013.01); *H03L 7/093* (2013.01); *H04L 7/0331* (2013.01)

(58) Field of Classification Search
CPC ...... H04L 7/0337; H04L 7/0331; H04L 7/093
See application file for complete search history.

(56) References Cited

U.S. PATENT DOCUMENTS

| | | | |
|---|---|---|---|
| 6,831,523 B1 | 12/2004 | Pastorello et al. | |
| 7,929,919 B2 | 4/2011 | Coppin | |
| 9,509,490 B1 | 11/2016 | Dabral | |
| 10,659,064 B1 | 5/2020 | Yoo et al. | |
| 2009/0147901 A1 * | 6/2009 | Do | H04L 7/0331 |
| | | | 375/375 |
| 2020/0112314 A1 | 4/2020 | Tertinek | |

* cited by examiner

*Primary Examiner* — Rahel Guarino

(74) *Attorney, Agent, or Firm* — Kowert, Hood, Munyon, Rankin & Goetzel, P.C.; Paul T. Seegers; Dean M. Munyon

(57) ABSTRACT

A clock generator circuit may include a multiplex circuit and a phase-locked loop circuit. The multiplex circuit may generate a reference clock signal for the phase-locked loop circuit by selecting one of different clock signals. In response to a switch of the reference clock signal from one clock signal to another, the phase-locked loop circuit may disable phase-locking and enter into a frequency acquisition mode during which the frequency of the phase-locked loop circuit's output clock signal is adjusted based on the frequency of the newly selected reference clock signal. After a period of time has elapsed, the phase-locked loop circuit returns to phase-locking operation.

20 Claims, 14 Drawing Sheets

Logic
Circuit
301

Signal
503

Selection
Signal
214

Timer
Circuit
502

Reference
Switch Signal
108

Reset Signal
211

State Machine
Circuit
501

Clock
Information
504

Phase
Trigger
Signal
304

Frequency
Trigger
Signal
305

*700*

REFERENCE CLOCK SWITCHING IN PHASE-LOCKED LOOP CIRCUITS

PRIORITY INFORMATION

The present application is a continuation of U.S. application Ser. No. 18/152,492, entitled "Reference Clock Switching in Phase-Locked Loop Circuits," filed Jan. 10, 2023, which claims priority to U.S. Provisional App. No. 63/365,434, entitled "Reference Clock Switching in Phase-Locked Loop Circuits," filed May 27, 2022; the disclosures of each of the above-referenced applications are incorporated by reference herein in their entireties.

BACKGROUND

Technical Field

This disclosure is generally directed to phase-locked loop circuits in computer systems, and more particularly to reference clock switching for phase-locked loop circuits.

Description of the Related Art

Computer systems often employ periodic signals (often referred to as "clock signals") to relay timing information to different circuits included in such computer systems. The timing information may be used, for example, by latch or flip-flop circuits to sample and hold data. Additionally, the timing information may be used in sending and receiving data between different circuit blocks within an integrated circuit, or between different integrated circuits.

Clock signals may be generated using a variety of frequency synthesis circuits and techniques. Phase-locked loop (PLL) or delayed-locked loop (DLL) circuits may, in turn, be employed to generate other clock signals of differing frequencies and phases relative to a reference clock signal.

Reference clock signals may be generated using a variety of techniques. In some cases, a crystal oscillator may be used to generate a reference clock signal that is stable over a range of temperature and power supply voltage values. In other cases, a reference clock may be generated by clock recovery circuits receiving a serial data stream. In various cases, a reference clock may be a spread spectrum clock where its frequency is modulated over a range of frequencies to reduce electromagnetic interference (EMI).

Figure 1:
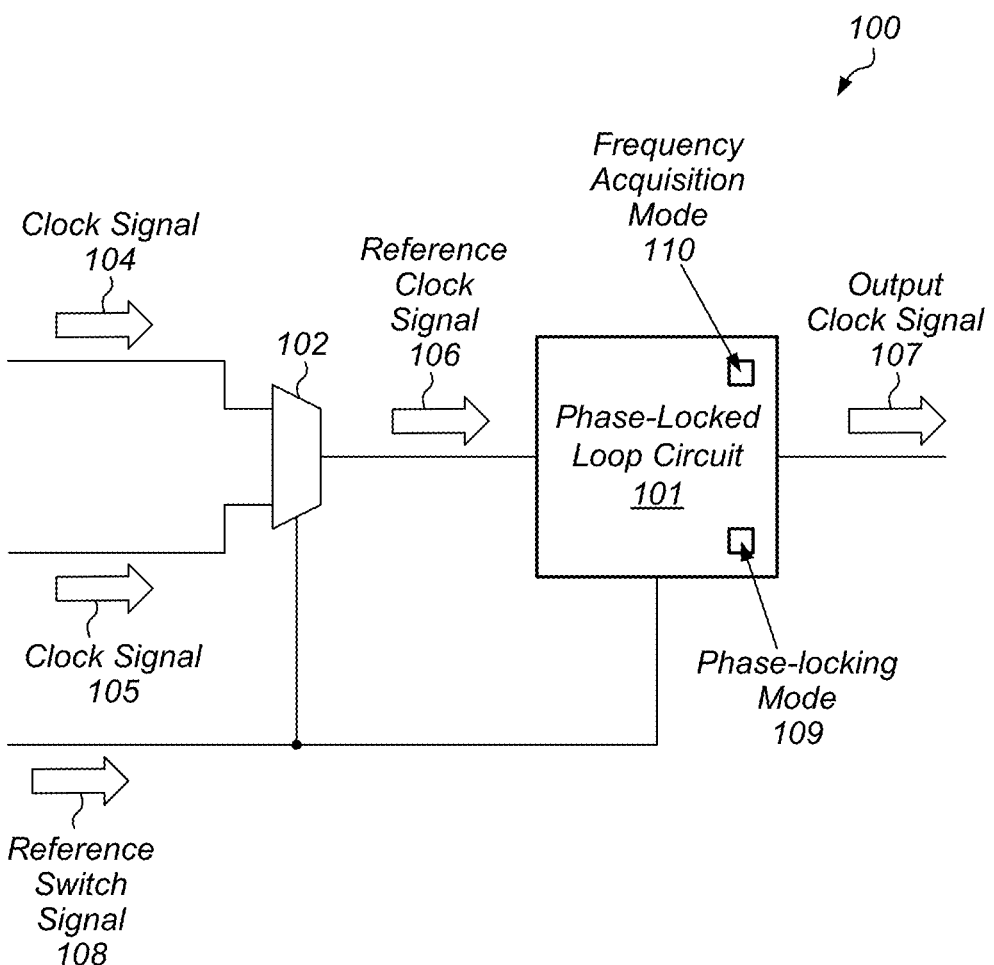
FIG. 1 is a block diagram of an embodiment of a clock generator circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed but, on the contrary, the intention is to cover all modifications, equivalents and alternatives falling within the spirit and scope of the appended claims.

DETAILED DESCRIPTION OF EMBODIMENTS

Many computer systems employ clock generator circuits to generate various clock signals to be used as timing references within the computer system by various circuits. Some clock generator circuits include phase-locked loop circuits (PLLs), which use a reference clock signal (often generated by a crystal oscillator circuit) to generate clock signals with frequencies that are multiples of the reference clock signal frequency.

Within a computer system, one particular example of where clock generator circuits are employed are communication interface circuits. Computer systems can include multiple integrated circuits that are coupled to each other via parallel and serial communication links. A parallel communication link transmits and receives multiple bits in parallel, while a serial communication link transmits and receives a single symbol at a time. In both cases, clock generator circuits are employed to generate clock signals, transmit clock signals, receive clock signals, perform clock recovery, and the like.

Serial data streams are often transmitted without an accompanying clock signal. In such cases, a clock signal is recovered from the serial data stream (in a process referred to as "clock recovery") and used for sampling the serial data stream to determine the values of the included data symbols. Various techniques can be employed to recover a clock signal. For example, a receiver circuit may generate a clock signal whose frequency is approximately the same as that of a clock signal used to create the data stream. A phase-locked loop circuit may then be used to phase align the clock signal with transitions in the serial data stream. Alternatively, the serial data stream may be oversampled, i.e., sampled at a higher frequency than that of the clock signal used to generate the serial data stream.

When a serial communication link begins operation after being powered down or entering a sleep mode, a training operation is typically performed. During the training operation, a particular data pattern is sent from a transmitter circuit to a receiver circuit. The receiver circuit uses transitions in the particular data pattern to initialize clock and data recovery circuits. After the training operation is concluded, the transmitter circuit can begin to send actual data.

In some cases, other circuits included in the receiver circuit, or coupled to the receiver circuit, need to operate despite the recovered clock signal being unavailable. To provide the needed clock signal for such circuits, a clock generator circuit that includes a PLL circuit may be employed. A crystal oscillator circuit or other suitable circuit can be employed to provide a timing reference for the PLL circuit.

Once the training period has completed, the recovered clock signal can then be used for the PLL circuit. Abrupt switching of the timing reference for the PLL circuit can, however, result in the PLL losing lock allowing the frequency of its output clock signal to drift, which can lead to timing failures within the receiver circuit or other circuits coupled to the receiver circuit. The problem associated with switching reference signals for the PLL circuit can be exacerbated in cases where the recovered clock signal is a spread spectrum clock signal whose frequency varies over a range of frequencies as the PLL circuit can take an even longer time to lock.

The embodiments illustrated in the drawings and described below provide techniques for switching the reference clock signal for a PLL circuit. By switching from a phase locking mode to a frequency acquisition mode during the change in reference clock signal, an oscillator circuit included in the PLL circuit can be quickly set to the frequency of the new reference clock signal reducing the time for the output clock signal of the PLL to lock to the new frequency and reducing the likelihood of timing issues of other circuits using the output clock signal.

A block diagram of an embodiment of a clock generator circuit is depicted in FIG. 1. As illustrated, clock generator circuit 100 includes phase-locked loop circuit 101 and multiplex circuit 102.

Multiplex circuit 102 is configured to generate reference clock signal 106 using clock signal 104, clock signal 105, and reference switch signal 108. Multiplex circuit 102 may be configured to generate reference clock signal 106 using clock signal 104 in response to a determination that reference switch signal 108 is inactive. In response to an activation of reference switch signal 108, multiplex circuit 102 is configured to generate reference clock signal 106 using clock signal 105.

When switching between clock signal 104 and clock signal 105, short pulses (referred to as "glitches") may occur in reference clock signal 106 during the switch from one clock signal to another. To avoid such glitches in reference clock signal 106, multiplex circuit 102 may include negative-edge triggered D-type flip-flop circuits in the selection path for clock signal 104 and clock signal 105 to prevent switching from one clock signal to another during periods of time when either of clock signal 104 or clock signal 105 are at logical-1 value. It is noted that the use of negative-edge triggered D-type flip-flop circuits is an example of one technique for preventing glitches on reference clock signal 106 and, in other embodiments, other techniques may be employed.

In various embodiments, clock signal 104 may be generated by a crystal oscillator circuit or other suitable oscillator circuit. Clock signal 105 may, in other embodiments, be generated by a clock recovery circuit included in a receiver circuit configured to receive one or more signals that encode a serial data stream. In some cases, a frequency of clock signal 105 may periodically vary between two frequency values about a center frequency.

As used herein, when a signal is activated, it is set to a logic or voltage level that activates a load circuit or device. The logic level may be either a high logic level or a low logic level depending on the load circuit. For example, an active state of a signal coupled to a p-channel metal-oxide semiconductor field-effect transistor (MOSFET), Fin field-effect transistor (FinFET), or gate-all-around field-effect transistor (GAAFET) is a low logic level (referred to as an "active low signal"), while an active state of a signal coupled to an n-channel MOSFET, FinFET, or GAAFET is a high logic level (referred to as an "active high signal").

Phase-locked loop circuit 101 is configured to generate output clock signal 107 using reference clock signal 106. In various embodiments, phase-locked loop circuit 101 is configured to operate in either phase-locking mode 109 or frequency acquisition mode 110. When operating in phase-locking mode 109, phase-locked loop circuit 101 is configured to adjust a frequency of output clock signal 107 using a phase difference between reference clock signal 106 and output clock signal 107. When operating in frequency acquisition mode 110, phase-locked loop circuit 101 is configured to adjust the frequency of output clock signal 107 based on a frequency difference between reference clock signal 106 and output clock signal 107.

In response to the activation of reference switch signal 108, phase-locked loop circuit 101 is configured to deactivate phase-locking mode 109 and activate frequency acquisition mode 110. In various embodiments, phase-locked loop circuit 101 is further configured to reactivate phase-locking mode 109 in response to a determination that a particular period of time has elapsed since the activation of reference switch signal 108. By switching to frequency acquisition mode 110 for a period of time after a change in reference clock signal 106, phase-locked loop circuit 101 can reduce an amount of time required to adjust the frequency of output clock signal 107 to a new frequency, thereby reducing the amount of time the frequency of output clock signal 107 may be incorrect or in an indeterminate state.

Figure 2:
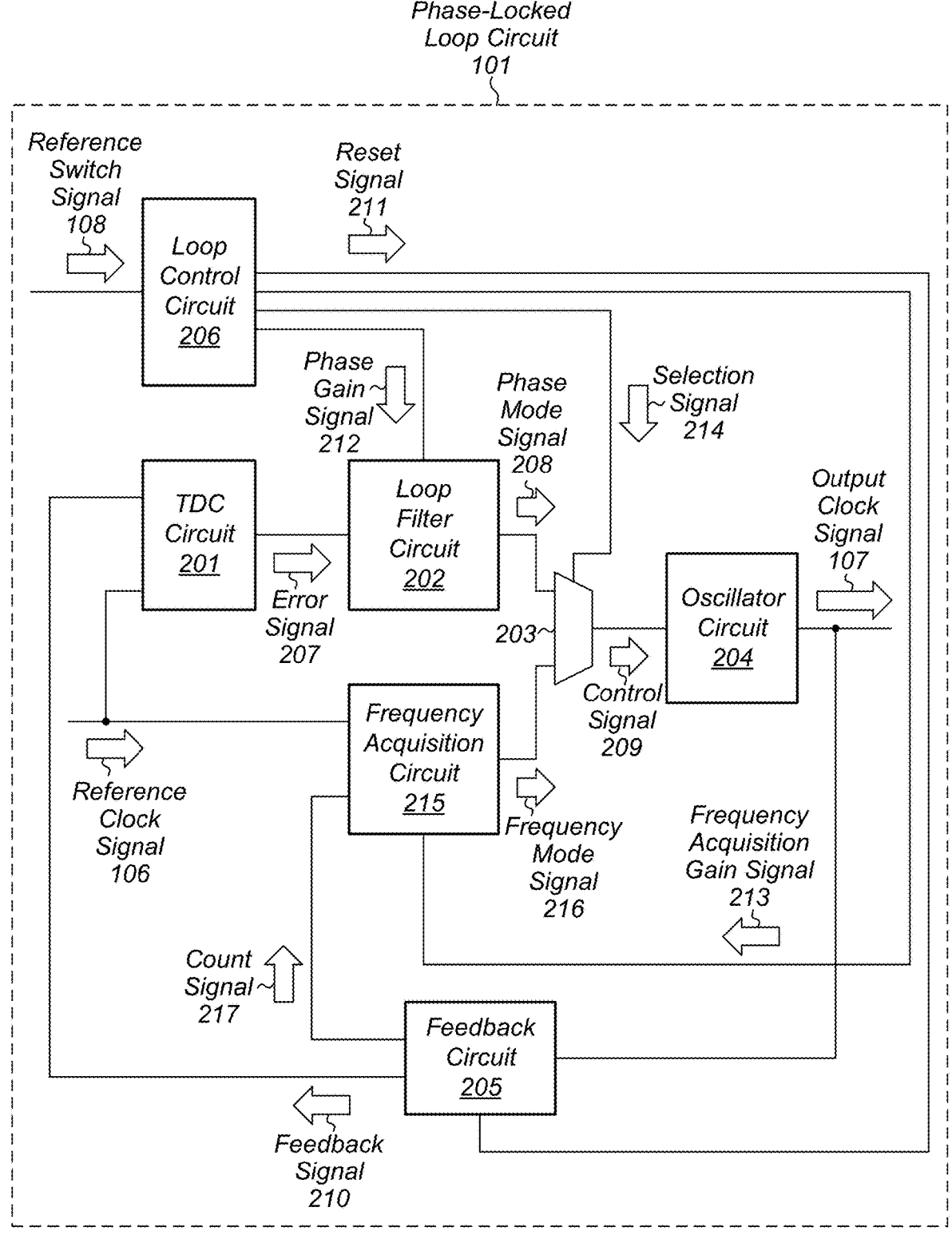
FIG. 2 illustrates a block diagram of an embodiment of a phase-locked loop circuit.

Turning to FIG. 2, a block diagram of phase-locked loop circuit 101 is depicted. As illustrated, phase-locked loop circuit 101 includes time-to-digital converter circuit 201 (denoted as "TDC circuit 201"), loop filter circuit 202, multiplex circuit 203, oscillator circuit 204, feedback circuit 205, loop control circuit 206, and frequency acquisition circuit 215.

TDC circuit 201 is configured to generate error signal 207 using reference clock signal 106 and feedback signal 210. As described below, TDC circuit 201 may be configured to generate error signal 207 based on a phase difference between reference clock signal 106 and feedback signal 210. In various embodiments, error signal 207 may be a multi-bit word whose value is indicative of the phase difference between the reference clock signal 106 and feedback signal 210.

Loop filter circuit 202 is configured to generate phase mode signal 208 using error signal 207. In various embodiments, loop filter circuit 202 may be further configured to scale error signal 207 by phase gain signal 212 to generate phase mode signal 208. Loop filter circuit 202 may, in different embodiments, be implemented as a simple gain filter circuit, a difference filter circuit, an average filter circuit, or any other suitable type of digital filter circuit.

Frequency acquisition circuit 215 is configured to generated frequency mode signal 216 using count signal 217, reference clock signal 106, and frequency acquisition gain signal 213. In various embodiments, frequency acquisition circuit 215 is configured to function as a frequency-locked loop circuit and to generate frequency mode signal 216 based on a difference between the frequency of output clock signal 107 and reference clock signal 106. In some embodiments, frequency acquisition circuit 215 may be configured to generate a difference between reference clock signal 106 and count signal 217. Frequency acquisition circuit 215 may be further configured to scale the difference between reference clock signal 106 and count signal 217 using frequency acquisition gain signal 213, and filter the scaled result to generate frequency mode signal 216.

Multiplex circuit 203 is configured to generate control signal 209 using phase mode signal 208, frequency mode signal 216, and selection signal 214. In various embodiments, multiplex circuit 203 is configured to select phase mode signal 208 to generate control signal 209 in response to a deactivation of selection signal 214. Multiplex circuit 203 is also configured to select frequency mode signal 216 to generate control signal 209 in response to an activation of selection signal 214. Multiplex circuit 203 may be implemented using a combination of logic gates, multiple pass gate circuits coupled together in a wired-OR fashion, or any suitable combination thereof.

Oscillator circuit 204 is configured to generate output clock signal 107 using control signal 209. In various embodiments, oscillator circuit 204 may be implemented using a digitally controlled oscillator circuit. In such cases, control signal 209 may include multiple bits that adjust the values of reactive components (e.g., varactors) included in oscillator circuit 204. By adjusting the value of such reactive components, a frequency of output clock signal 107 can be varied.

It is noted that the path through phase-locked loop circuit 101 starting at the output of oscillator circuit 204, through feedback circuit 205, TDC circuit 201, loop filter circuit 202, and multiplex circuit 203 to the input of oscillator circuit 204 can be referred to as a "feedback loop." This feedback loop is used when phase-locked loop circuit 101 is operating in phase-locking mode. When phase-locked loop circuit 101 transitions to a frequency-locking mode as part of a reference clock switch, selection signal 214 is activated and control signal 209 is generated using frequency mode signal 216 instead of phase mode signal 208. When operated in frequency-locking mode, the feedback path in phase-locked loop circuit 101 starts at the output of oscillator circuit 204, and goes through feedback circuit 205, frequency acquisition circuit 215, and multiplex circuit 203 back to the input of oscillator circuit 203.

Feedback circuit 205 is configured to generate, using output clock signal 107, feedback signal 210 when phase-locked loop circuit is operating in phase-locking mode, and to generate, using output clock signal 107, count signal 217 when phase-locked loop circuit 101 is operating in frequency-locking mode. In various embodiments, a frequency of feedback signal 210 is the quotient of the frequency of output clock signal 107 and a divisor. In some cases, the divisor may a positive integer while, in other cases, the divisor may be a positive non-integer value. When a non-integer frequency divisor is employed, phase-locked loop circuit 101 may be referred to as a "fractional-N phase-locked loop circuit." In various embodiments, a value of count signal 217 may be indicative of a frequency of output clock signal 107. Count signal 217 may includes any suitable number of bits whose values encode information indicative of the frequency of output clock signal 107.

In some embodiments, feedback circuit 205 may be implemented using one or more counter circuits configured to increment in response to a detection of a transition in output clock signal 107. Feedback circuit 205 can generate count values to generate count signal 217 for use by frequency acquisition circuit 215 during frequency-locking operation. During phase-locking operation, feedback circuit 205 can use the count values and the frequency divisor to determine when to generate a transition in feedback signal 210. In response to an activation of reset signal 211, the one or more counter circuits, along with other sequential logic circuits, may be reset to preset values.

Loop control circuit 206 is configured to generate reset signal 211, selection signal 214, frequency acquisition gain signal 213, and phase gain signal 212 using reference switch signal 108. In various embodiments, loop control circuit 206 may be configured to activate reset signal 211 and selection signal 214, and frequency acquisition gain signal 213 in response to an activation of reference switch signal 108. After a particular time period has elapsed since the activation of reference switch signal 108, loop control circuit 206 may be configured to generate phase gain signal 212, and deactivate reset signal 211 and selection signal 214. As described below, loop control circuit 206 may be implemented using a variety of combinatorial and sequential logic circuits.

Figure 3:
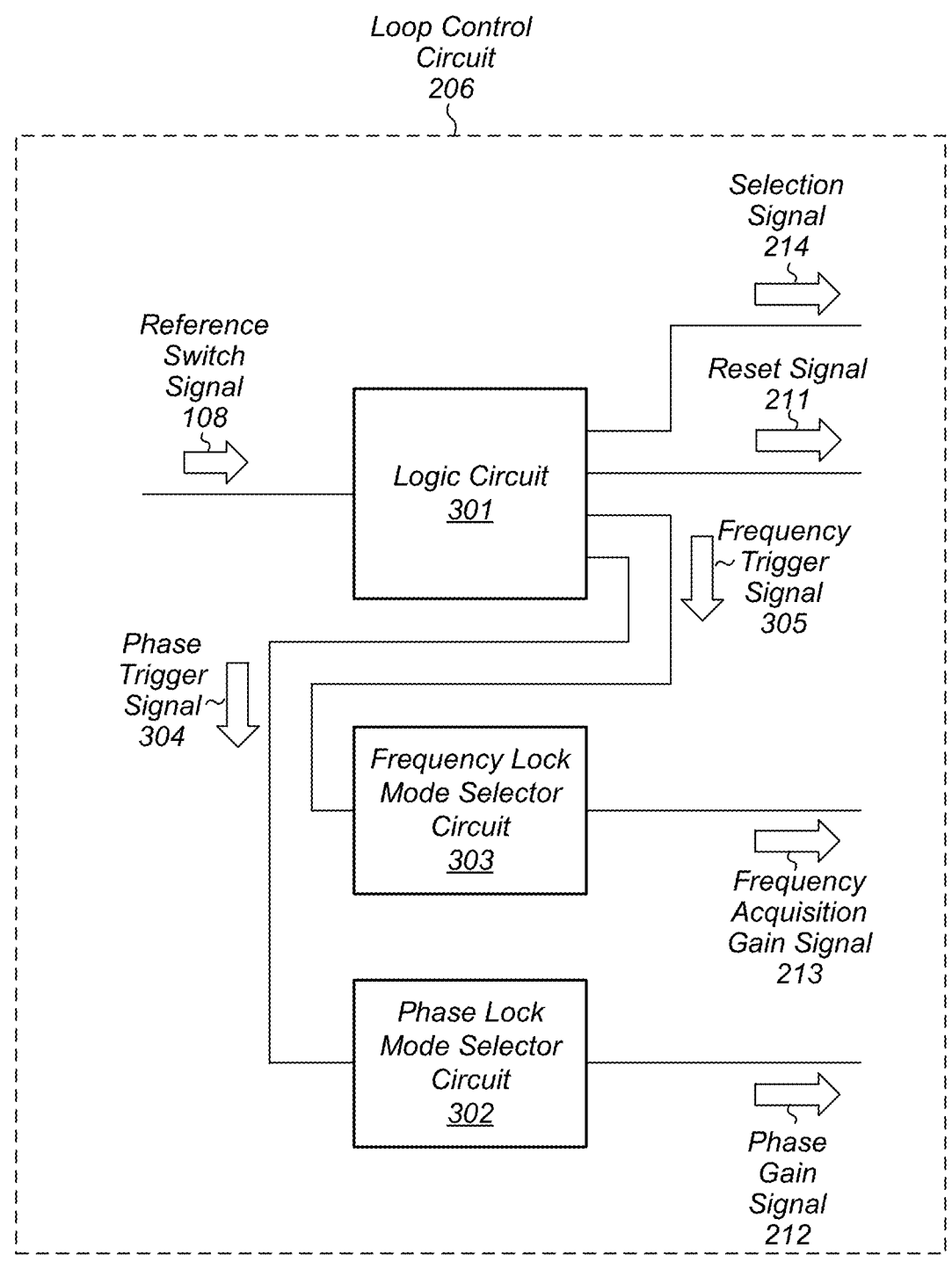
FIG. 3 illustrates a block diagram of an embodiment of a loop control circuit.

A block diagram of loop control circuit 206 is depicted in FIG. 3. As illustrated, loop control circuit 206 includes logic circuit 301, phase lock mode selector circuit 302, and frequency lock mode selector circuit 303.

Logic circuit 301 is configured to generate selection signal 214, reset signal 211, settings 213, phase trigger signal 304, and frequency trigger signal 305 using reference switch signal 108. In various embodiments, logic circuit 301 may be configured to activate selection signal 214 and reset signal 211 in response to an activation of reference switch signal 108.

Logic circuit 301 may also be configured to generate frequency trigger signal 305 after a particular period of time has elapsed since an activation of reference switch signal 108. In various embodiments, the particular period of time may be programmable and correspond to an amount of time for frequency acquisition circuit 215 to acquire the frequency of clock signal 105 before returning to phase-locking based operation.

In some embodiments, logic circuit 301 may be configured to activate phase trigger signal 303 after a particular period of time has elapsed since the activation of reference switch signal 108. The particular period of time may be programmable and correspond to an amount of time for phase-locked loop circuit 101 to acquire the frequency of clock signal 105 before returning to phase-locking based operation.

Phase lock mode selector circuit 302 is configured to generate phase gain signal 212 using trigger signal 303. In various embodiments, phase gain signal 212 may include multiple bits and phase mode selector circuit 302 may be further configured to adjust the value of phase gain signal 212 over a period of time to change the bandwidth of the feedback loop of phase-locked loop circuit 101 as it returns from frequency acquisition mode to phase-locking operation.

Frequency lock mode selector circuit 303 is configured to generate frequency acquisition gain signal 213. In various embodiments, frequency acquisition gain signal 213 may include multiple bits. In some cases, frequency lock mode selector circuit 303 may be further configured to vary frequency acquisition gain signal 213 over time to change the bandwidth of the feedback look used by frequency acquisition circuit 213 as phase-locked loop circuit 101 transitions to frequency acquisition mode from phase-locking mode.

When phase-locked loop circuit 101 returns to phase-locking operation, phase gain signal 212 may be adjusted based on a desired level of jitter in output clock signal 107. In various embodiments, phase-locked loop circuit 101 allows for two switching options as phase-locking operation is re-enabled.

In one switching option, a smooth transition from frequency acquisition mode to phase-locking mode is accomplished by varying phase gain signal 212 from an ultra-low bandwidth value to a low-bandwidth value. By varying the loop bandwidth of phase-locked loop circuit 101 in such a manner, the phase-locked loop circuit 101 can achieve phase lock while minimizing jitter in output clock signal 107.

In another switching option, an abrupt transition from frequency acquisition mode to phase-locking mode is allowed. In this case, phase gain signal 212 is varied from a high-bandwidth value to the low-bandwidth value. The high-bandwidth value can allow for a faster phase lock time at the expense of jitter in output clock signal 107. In some cases, varying phase gain signal 212 in this fashion can result in an overshoot in the frequency of output clock signal 107 from its desired value.

Figure 4:
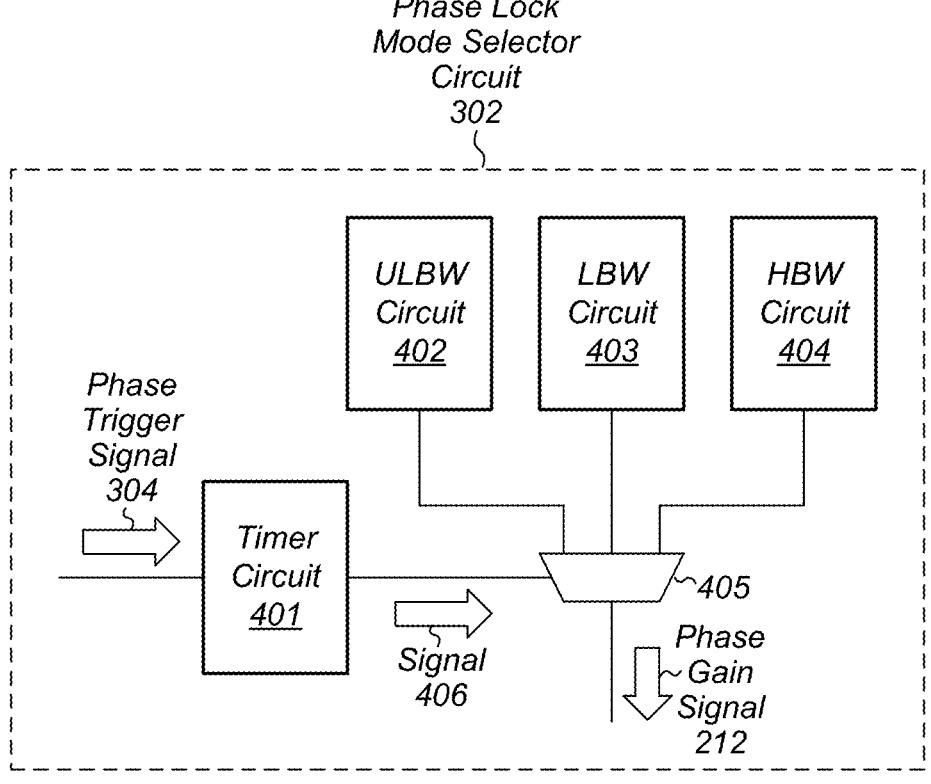
FIG. 4 illustrates a block diagram of an embodiment of a phase lock mode selection circuit.

Turning to FIG. 4, a block diagram of phase lock mode selector circuit 302 is depicted. As illustrated, phase lock mode selector circuit 302 includes timer circuit 401, an ultra-low bandwidth circuit (denoted as "ULBW circuit 402"), a low-bandwidth circuit (denoted as "LBW circuit 403"), a high-bandwidth circuit ("denoted as "HBW circuit 404"), and multiplex circuit 405.

Timer circuit 401 is configured to generate signal 406 using phase trigger signal 304. In various embodiments, timer circuit 401 is configured to change a value of signal 406 in response to an activation of trigger signal 303. Timer circuit 401 may be further configured to change the value of signal 406 after a particular time period has elapsed since the activation of trigger signal 303.

Timer circuit 401 may, in various embodiments, include multiple timer circuits used to determine the duration the respective outputs of each of ULBW circuit 402, LBW circuit 403, and HBW circuit 404 to generate phase gain signal 212. Such timer circuits may be implemented using any suitable combination of combinatorial and sequential logic circuits.

Multiplex circuit 405 is configured to generate phase gain signal 212 using the outputs of ULBW circuit 402, LBW circuit 403, HBW circuit 404, and signal 406. In various embodiments, multiplex circuit 405 is configured to select a particular one of the outputs of ULBW circuit 402, LBW circuit 403, or HBW circuit 404 based on a value of signal 406.

Multiplex circuit 405 may be implemented using any suitable combination of logic gates. In other embodiments, multiplex circuit 405 may be implemented using multiple pass-gate circuits coupled together in a wired-OR fashion.

Each of ULBW circuit 402, LBW circuit 403, and HBW circuit 404 is configured to store respective gain value for phase gain signal 212. In various embodiments, each of ULBW circuit 402, LBW circuit 403, and HBW circuit 404 may be implemented using register circuits or any other suitable storage circuit. In some embodiments, the values stored in ULBW circuit 402, LBW circuit 403, and HBW circuit 404 may be programmable.

Figure 5:
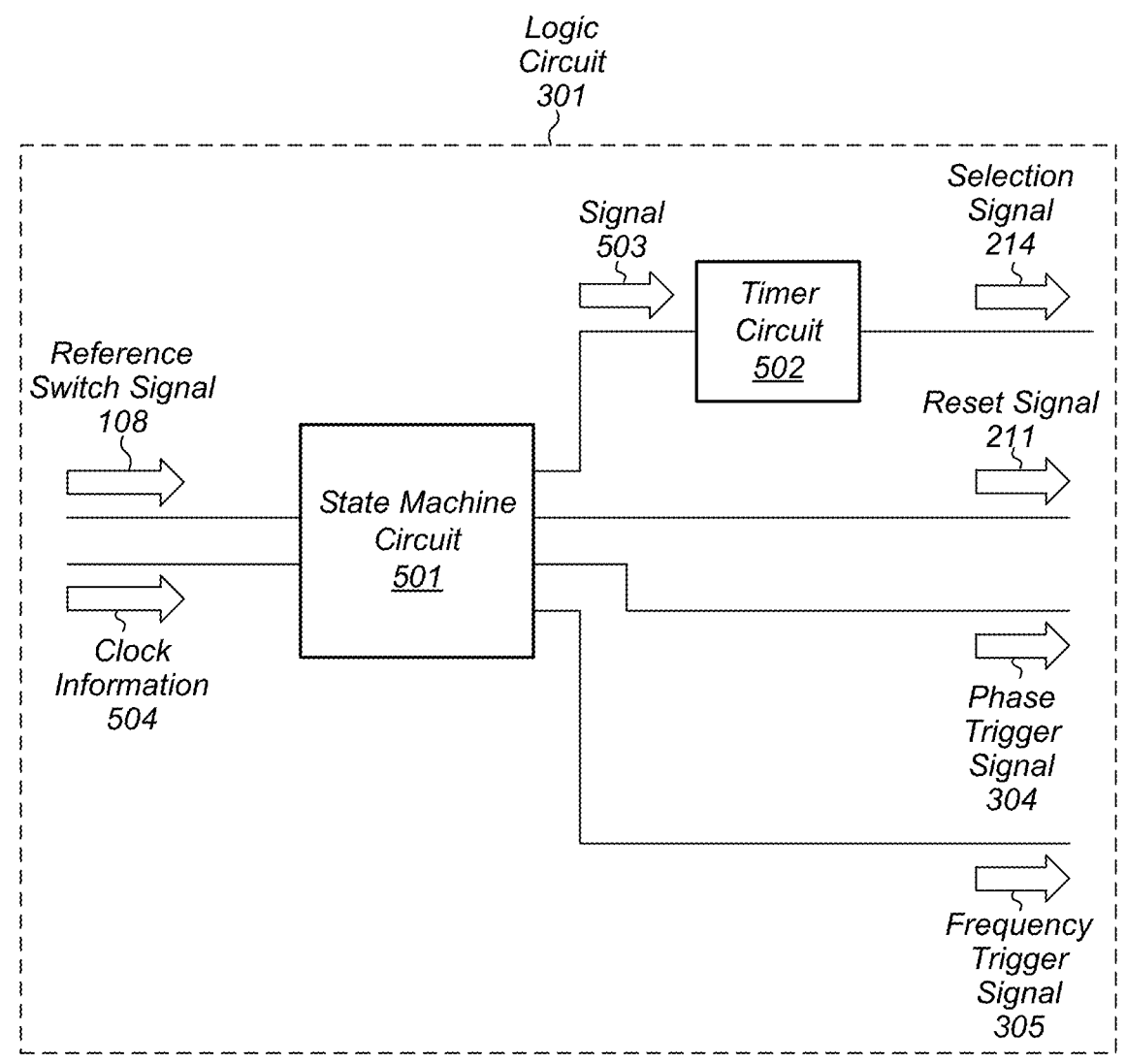
FIG. 5 illustrates a block diagram of an embodiment of a logic circuit for a loop control circuit.

Turning to FIG. 5, a block diagram of logic circuit 301 is depicted. As illustrated, logic circuit 301 includes state machine circuit 501 and timer circuit 502.

State machine circuit 501 is configured to generate signal 503, reset signal 211, and trigger signal 303 using reference switch signal 108. Additionally, state machine circuit 501 is also configured to generate frequency acquisition loop signal 305 using reference switch signal 108 and clock information 504. In various embodiments, state machine circuit 501 is configured to activate signal 503, reset signal 211, and trigger signal 304 in response to a determination that reference switch signal 108 has been activated. State machine circuit 501 may be implemented using any suitable combination of combinatorial logic circuits and sequential logic circuits.

Clock information 504 may, in different embodiments, include information indicative of clock signal 105. For example, clock information 504 may include information indicative of the frequency of clock signal 105, whether clock signal 105 is a spread spectrum clock, and the like.

Timer circuit 502 is configured to generate selection signal 214 using signal 503. In various embodiments, timer circuit 502 is configured to activate selection signal 214 in response to an activation of signal 503. After a particular period of time has elapsed, timer circuit 502 is configured to deactivate selection signal 214. The particular period of time may, in various embodiments, correspond to a duration of frequency acquisition mode 110. Timer circuit 502 may be implemented using one or more counter circuits or any other suitable sequential logic circuit.

Figure 6:
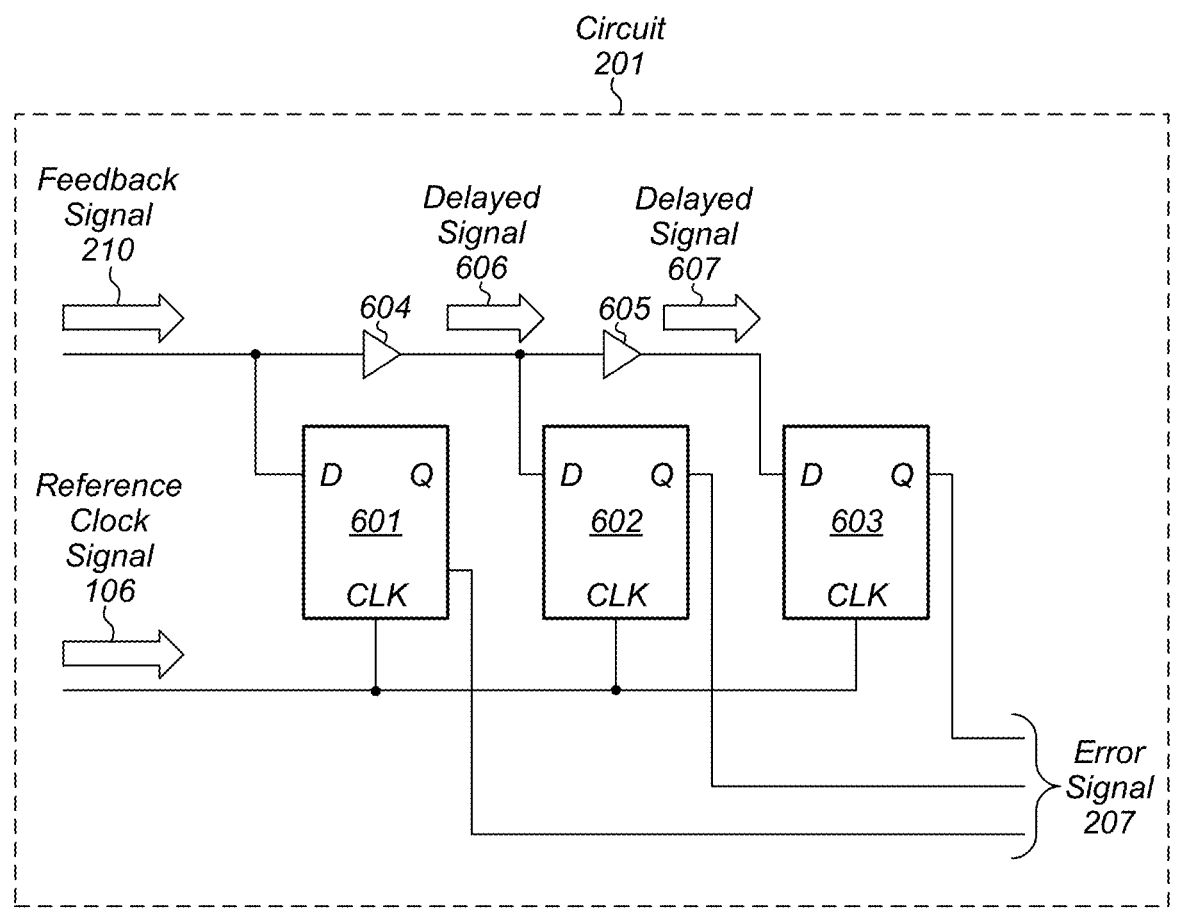
FIG. 6 illustrates a block diagram of an embodiment of a time-to-digital converter circuit.

Turning to FIG. 6, a block diagram of an embodiment of TDC circuit 201 is depicted. As illustrated, TDC circuit 201 includes latch circuits 601-603, buffer circuit 604, and buffer circuit 605.

Buffer circuit 604 is configured to generate delayed signal 606 using feedback signal 210. In a similar fashion, buffer circuit 605 is configured to generate delayed signal 607 using delayed signal 606. In various embodiments, the amount of delay between feedback signal 210 and delayed signal 606, as well as the amount of delay between delayed signal 606 and delayed signal 607 may be selected based on a desired resolution of the measurement of the phase difference between feedback signal 210 and reference clock signal 106. Buffer circuits 604 and 605 may, in various embodiments, be implemented using inverter circuits coupled in series, or any other suitable non-inverting amplifier circuits.

Latch circuit 601 is configured to capture a state of feedback signal 210 in response to a rising edge of reference clock signal 106. In a similar fashion, latch circuits 602 and 603 are configured to capture respective states of delayed signal 606 and delayed signal 607 in response to the rising edge of reference clock signal 106. In other words, latch circuits 601-603 capture the state of a delay line formed by buffer circuits 604 and 605. Latch circuits 601-603 may be implemented using D-type latch circuits, or any other suitable type of latch circuits.

Error signal 207 includes the output bits from latch circuits 601-603. The number of bits in error signal 207 that have a logical-1 value depends on the phase difference between feedback signal 210 and reference clock signal 106.

For example, the larger the phase difference, the more of the bits included in error signal 207 will be a logical-1 value.

Although three latch circuits are depicted in the embodiment of FIG. 6, in other embodiments, any suitable number of latch circuits may be employed. In general, the larger the number of latch circuits employed, the larger the number of bits included in error signal 207 allowing for a more accurate determination of the phase difference between output clock signal 107 and reference clock signal 106.

It is noted that the time-to-digital converter circuit depicted in FIG. 6 employs a delay line-based architecture. In other embodiments, any other suitable time-to-digital converter circuit architecture may be employed. For example, in some embodiments, a time amplification architecture, a counter-based architecture, or a time-to-amplitude architecture may be employed.

Figure 7:
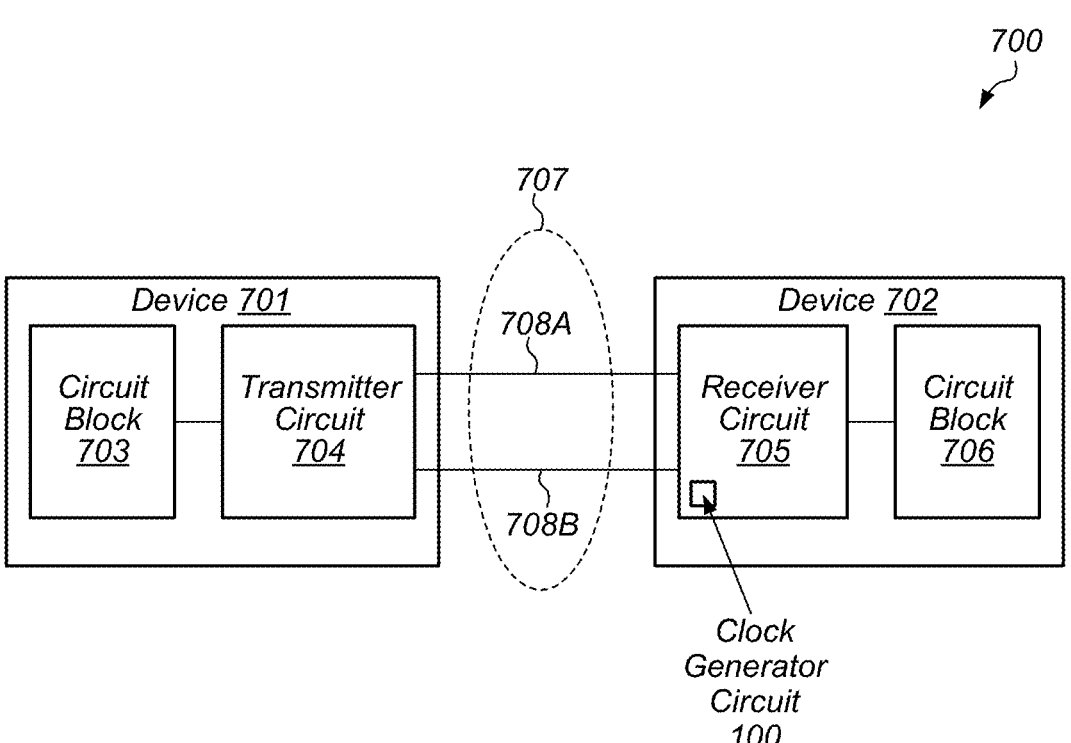
FIG. 7 illustrates a block diagram of an embodiment of a computer system that includes a communication link.

As described above, a clock generator circuit, such as clock generator circuit 100, may be used in a computer system with a communication link or bus. A block diagram of an embodiment of such a computer system is depicted in FIG. 7. As illustrated, computer system 700 includes devices 701 and 702, coupled by communication bus 707.

Device 701 includes circuit block 703 and transmitter circuit 704. In various embodiments, device 701 may be a processor circuit, a processor core, a memory circuit, a re-timer circuit, or any other suitable circuit block that may be included on an integrated circuit in a computer system. It is noted that although device 701 only depicts a single circuit block and a single transmitter circuit, in other embodiments, additional circuit blocks and additional transmitter circuits may be employed.

Transmitter circuit 704 is configured to serially transmit signals, via communication bus 707, corresponding to data received from circuit block 703. Such signals may differentially encode one or more bits such that a difference between the respective voltage levels of wires 708A and 708B, at a particular point in time, correspond to a particular bit value. In some cases, the generation of the signals may include encoding the bits prior to transmission. It is noted that although communication bus 707 is depicted as including two wires, in other embodiments, any suitable number of wires may be employed. In some cases, transmitter circuit 704 may be further configured to generate the transmit signals according to one of various communication protocols, such as the USB protocol. In some embodiments, transmitter circuit 704 may periodically activate a training mode in which known data is sent to device 702 allowing receiver circuit 705 to determine settings for clock and data recovery. At the conclusion of such training operations, a reference clock switch may be activated.

Device 702 includes receiver circuit 705 and circuit block 706. In various embodiments, receiver circuit 705 includes clock generator circuit 100. Like device 701, device 702 may be a processor circuit, a processor core, a memory circuit, a re-timer circuit, or any other suitable circuit block configured to receive data from transmitter circuit 704. In various embodiments, receiver circuit 705 may be configured to place certain subcircuits within receiver circuit 705 into a sleep or power-down state when communication bus 707 is idle. As described above, clock generator circuit 100 is configured to switch reference clocks in response to an end of a training operation.

Devices 701 and 702 may, in some embodiments, be fabricated on a common integrated circuit. In other embodiments, devices 701 and 702 may be located on different integrated circuits mounted on a common substrate or circuit board. In such cases, communication bus 707 may include metal or other conductive traces on the substrate or circuit board. Although only two devices are depicted in computer system 700, in other embodiments, any suitable number of devices may be employed.

Figure 8:
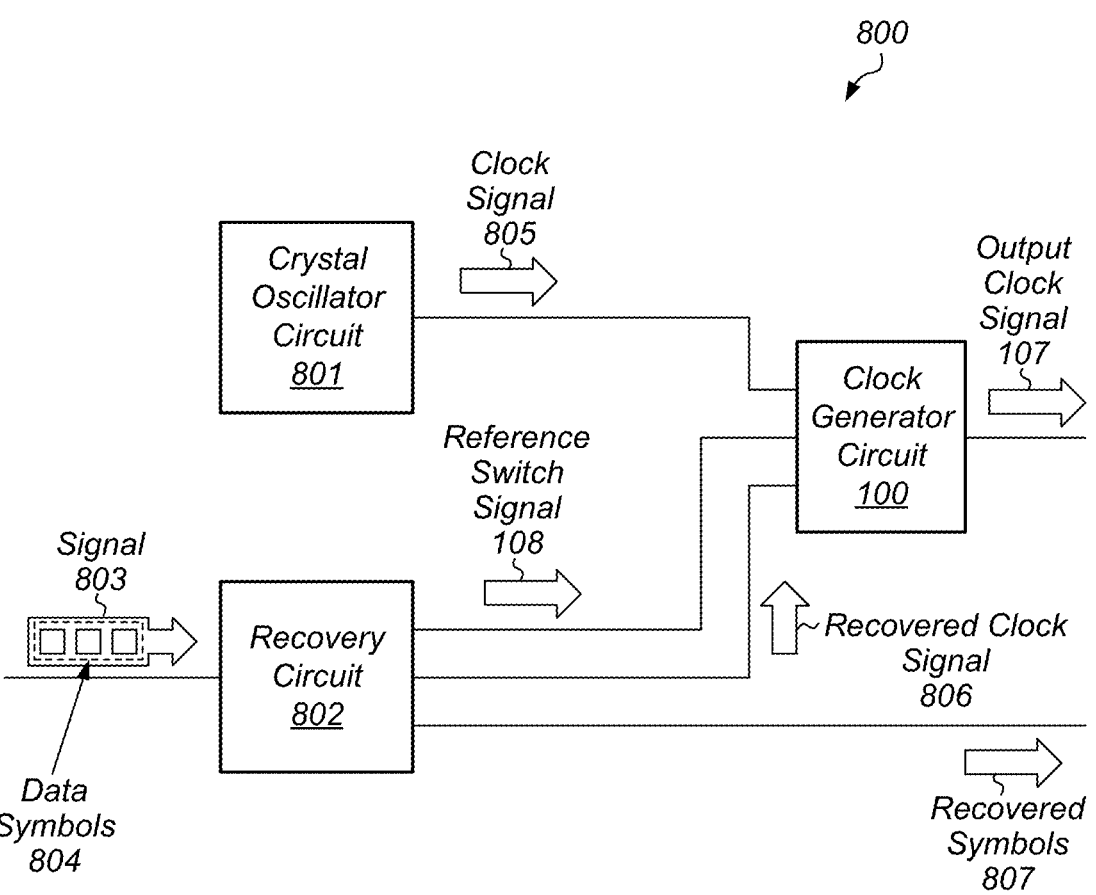
FIG. 8 is a block diagram of an embodiment of a receiver circuit for a serial communication link.

Turning to FIG. 8, a block diagram of a receiver circuit is depicted. As illustrated, receiver circuit 800 includes crystal oscillator circuit 801, recovery circuit 802, and clock generator circuit 100. In various embodiments, receiver circuit 800 may correspond to receiver circuit 705 as depicted in the embodiment of FIG. 7.

Crystal oscillator circuit 801 is configured to generate clock signal 805. In various embodiments, crystal oscillator circuit 801 may be implemented using a piezoelectric crystal to determine a frequency of oscillation. The piezoelectric crystal may be a quartz crystal, a polycrystalline ceramic crystal, or any other suitable type of piezoelectrical crystal.

Recovery circuit 802 is configured to receive signal 803. In various embodiments, signal 803 may encode data symbols 804. Although depicted as a single signal, in other embodiments, signal 803 may include multiple signals propagating through multiple wires or other conductive material, and a value of a particular one of data symbols 804 may correspond to different electrical characteristics (e.g., voltage) of the multiple signals at a given point in time. It is noted that a given one of data symbols 804 may correspond to a signal bit or multiple bits.

In various embodiments, recovery circuit 802 is configured to generate reference switch signal 108, recovered clock signal 806, and recovered symbols 807. In some embodiments, recovery circuit 802 may be configured to activate reference switch signal 108 in response to a completion of a training operation during which data symbols 804 may include a known data pattern allowing recovery circuit 802 to determine parameters (e.g., sampling thresholds, weights for decision feedback equalization, and the like) necessary to generate recovered clock signal 806 and recovered symbols 807.

To generate recovered clock signal 806 and recovered symbols 807, recovery circuit 802 may be configured to sample signal 803 at various points in time and using different sampling thresholds. In various embodiments, recovery circuit 802 may include one or more analog-to-digital converter circuits, or multiple sample circuits using corresponding ones of multiple sampling thresholds.

As described, clock generator circuit 100 is configured to generate output clock signal 107 using clock signal 805, recovered clock signal 806, and reference switch signal 108. It is noted that, in some embodiments, one or more subcircuits included in recovery circuit 802 may employ output clock signal 107.

Figure 9A:
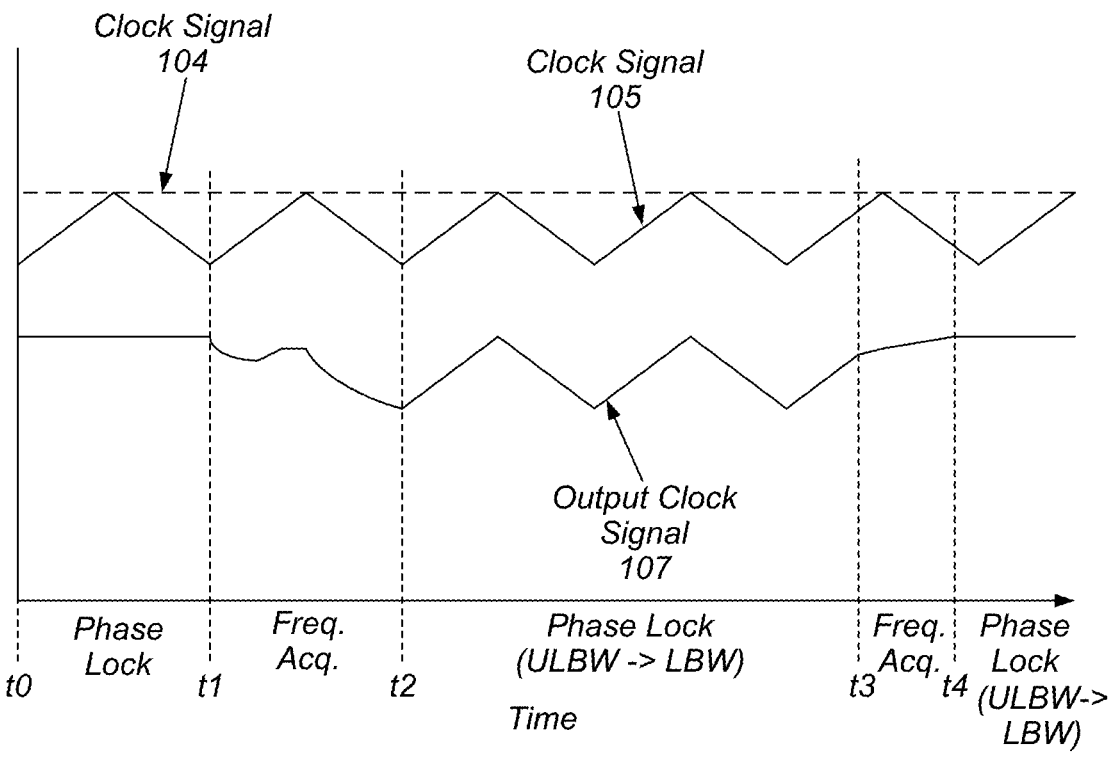
FIG. 9A illustrates clock frequency waveforms for reference clock switching using spread spectrum clocking and a smooth transition.

Turning to FIG. 9A, a diagram depicting clock frequency waveforms associated with reference clock switching using spread spectrum clocking and a smooth transition is depicted. It is noted that the waveforms depicted in FIG. 9A are examples and, in other embodiments, the waveforms may appear different, have different relative timings, and the like.

At time t0, phase-locked loop circuit 101 is operating in phase-locking mode 109 and is logic to clock signal 104. In the example of FIG. 9A, clock signal 104 has a constant frequency and may be generated by a crystal oscillator circuit or other suitable clock generator circuit.

At time t1, reference switch signal 108 is activated, causing reference clock signal 106 to switch from clock signal 104 to clock signal 105. In the example of FIG. 9A, clock signal 105 is a spread spectrum clock whose frequency periodically varies between two values. In response to the activation of reference switch signal 108, phase-locked loop circuit 101 transitions from phase-locking mode 109 to frequency acquisition mode 110 causing output clock signal 107 to begin tracking the frequency of clock signal 105.

At time t2, loop control circuit 206 determines that adequate time has passed for acquiring the frequency of the reference clock signal, and phase-locked loop circuit 101 transitions back to phase-locking mode 109, where the frequency of output clock signal 107 is adjusted based on a phase difference between output clock signal 107 and reference clock signal 106. Over the time period between t2 and t3, the gain settings for loop filter circuit 202 are varied from ULBW settings to LBW settings to reduce jitter in output clock signal 107 as phase-locked loop circuit 101 locks to the new frequency of reference clock signal 106.

At time t3, reference switch signal 108 is deactivated causing reference clock signal 106 to switch from clock signal 105 back to clock signal 104. As described above, phase-locked loop circuit 101 again transitions to frequency acquisition mode 110 resulting in the frequency of output clock signal 107 tracking the frequency of clock signal 104.

At time t4, frequency acquisition mode 110 times out, causing phase-locked loop circuit 101 to transition to phase-locking mode 109. As described above, the gain settings for loop filter circuit 202 are started at ULBW settings when phase-locked loop circuit 101 enters phase-locking mode 109 and then transitioned to LBW settings to minimize jitter in output clock signal 107.

Figure 9B:
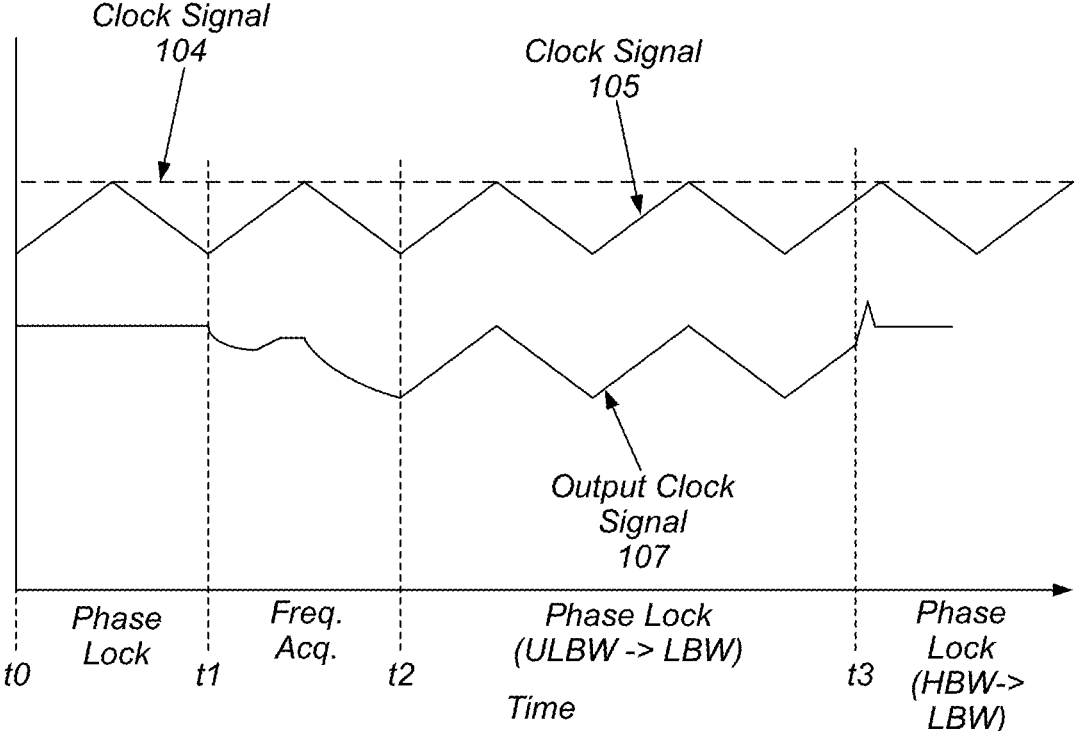
FIG. 9B illustrates clock frequency waveforms for reference clock switching using spread spectrum clocking and an abrupt transition.

Turning to FIG. 9B, a diagram depicting waveforms associated with reference clock switching using spread spectrum clocking and an abrupt transition is depicted. It is noted that the waveforms depicted in FIG. 9B are examples and, in other embodiments, the waveforms may appear different, have different relative timings, and the like.

The waveforms from time t0 to time t3 are the same as described above in regard to FIG. 9A. At time t3, rather than transition from phase-locking mode 109 to frequency acquisition mode 110 in response to the switch of reference clock signal 106 back to clock signal 104, loop control circuit 206 switches the gain settings for loop filter circuit 202 to HBW settings. Using HBW settings allows phase-locked loop circuit 101 to more quickly lock the frequency of clock signal 104. The HBW settings, however, can result in the frequency of output clock signal 107 momentarily overshooting the frequency of clock signal 104, resulting in jitter in output clock signal 107. After a period of time, loop control circuit 206 transitions phase gain signal 212 to the LBW value to reduce jitter in output clock signal 107.

Figure 10A:
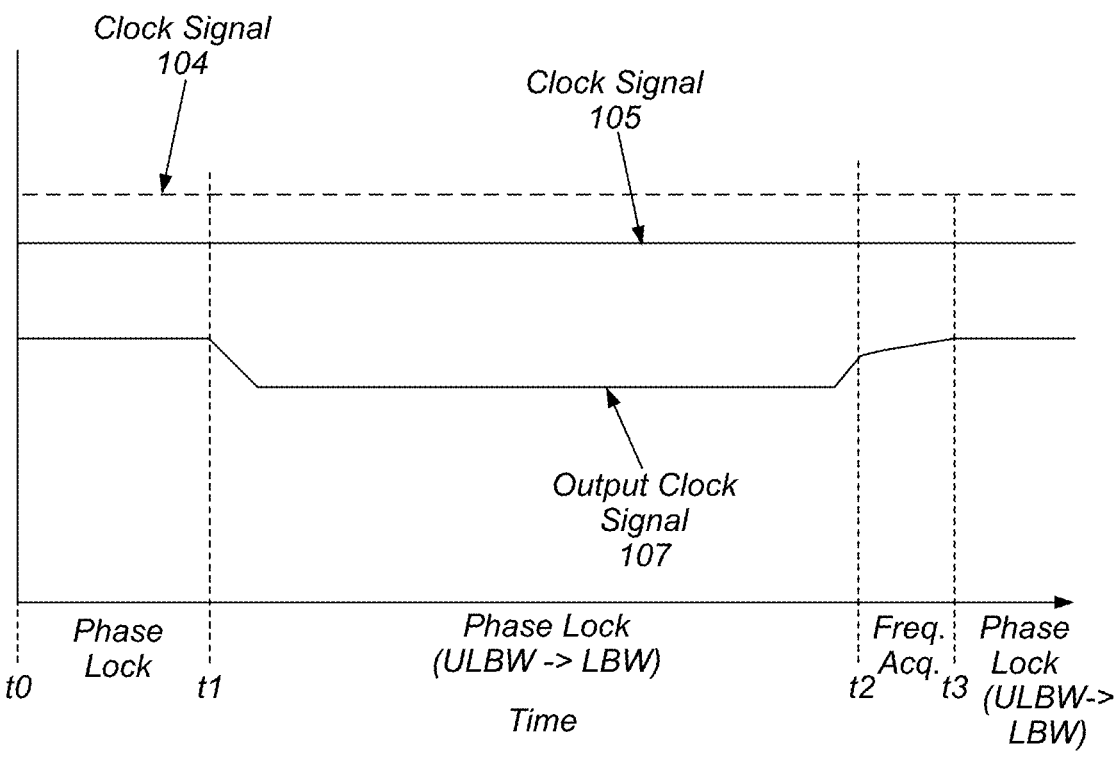
FIG. 10A illustrates clock frequency waveforms for reference clock switching without spread spectrum clocking and a smooth transition.

Turning to FIG. 10A, a diagram depicting waveforms associated with reference clock switching without spread spectrum clocking and a smooth transition is depicted. It is noted that the waveforms depicted in FIG. 10A are examples and, in other embodiments, the waveforms may appear different, have different relative timings, and the like.

At time t0, phase-locked loop circuit 101 is operating in phase-locking mode 109 and is logic to clock signal 104. In the example of FIG. 9A, clock signal 104 has a constant frequency and may be generated by a crystal oscillator circuit or other suitable clock generator circuit.

At time t1, reference switch signal 108 is activated, causing reference clock signal 106 to switch from clock signal 104 to clock signal 105. In the example of FIG. 10A, clock signal 105 has a constant frequency. In response to the activation of reference switch signal 108, phase-locked loop circuit 101 remains in phase-locking mode 109, but loop control circuit 206 transitions phase gain signal 212 to the ULBW value, allowing phase-locked loop circuit 101 to adjust the frequency of output clock signal 107 while minimizing jitter. Over a particular period of time, loop control circuit 206 varies the value of phase gain signal 212 from the ULBW value to the LBW value.

At time t2, reference switch signal 108 is deactivated causing reference clock signal 106 to switch from clock signal 105 back to clock signal 104. Phase-locked loop circuit 101 transitions to frequency acquisition mode 110 resulting in the frequency of output clock signal 107 to track the frequency of clock signal 104.

At time t3, frequency acquisition mode 110 times out, causing phase-locked loop circuit 101 to transition to phase-locking mode 109. As described above, the gain settings for loop filter circuit 202 are started at ULBW settings when phase-locked loop circuit 101 enters phase-locking mode 109 and then transitioned to LBW setting to minimize jitter in output clock signal 107.

Figure 10B:
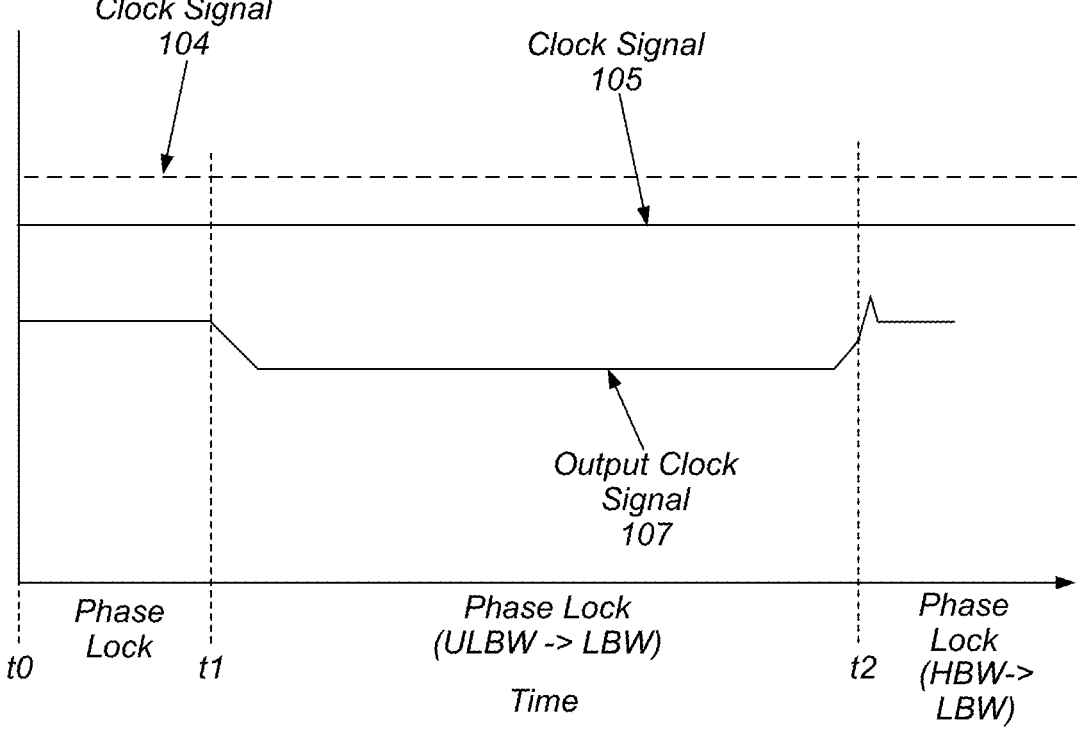
FIG. 10B illustrates clock frequency waveforms for reference clock switching without spread spectrum clocking and an abrupt transition.

Turning to FIG. 10B, a diagram depicting waveforms associated with reference clock switching without spread spectrum clocking and an abrupt transition is depicted. It is noted that the waveforms depicted in FIG. 10B are examples and, in other embodiments, the waveforms may appear different, have different relative timings, and the like.

The waveforms from time t0 to time t2 are the same as described above in regard to FIG. 10A. At time t2, rather than transition from phase-locking mode 109 to frequency acquisition mode 110 in response to the switch of reference clock signal 106 back to clock signal 104, loop control circuit 206 switches the gain settings for loop filter circuit 202 to HBW settings. Using HBW settings allows phase-locked loop circuit 101 to more quickly lock the frequency of clock signal 104. The HBW settings, however, can result in the frequency of output clock signal 107 momentarily overshooting the frequency of clock signal 104, resulting in jitter in output clock signal 107. After a period of time, loop control circuit 206 transitions phase gain signal 212 to the LBW value to reduce jitter in output clock signal 107.

To summarize, various embodiments of a phase-locked loop circuit are disclosed. Broadly speaking, an apparatus is contemplated in which a multiplex circuit is configured to generate a reference clock signal using a first clock signal and, in response to an activation of a reference switch signal, generate the reference clock signal using a second clock signal where a frequency of the second clock signal is different than a frequency of the first clock signal. A phase-locked loop circuit is configured to generate an output clock signal using the reference clock signal. In response to an activation of the reference switch signal, the phase-locked loop circuit is configured to deactivate a phase-locking mode and activate a frequency acquisition mode. The phase-locked loop circuit is further configured to reactivate the phase-locking mode in response to a determination that a particular period of time has elapsed since the activation of the reference switch signal.

In some embodiments, to deactivate the phase-locking mode, the phase-locked loop circuit is further configured to disable a feedback loop included in the phase-locked loop circuit. In other embodiments, the phase-locked loop circuit includes a digitally controlled oscillator circuit. To activate the frequency acquisition mode, the phase-locked loop circuit is further configured to load setting indicative of the frequency of the second clock signal into the digitally controlled oscillator circuit.

In various embodiments, the phase-locked loop circuit includes a loop filter circuit configured to generate a filtered signal using a gain value and an error signal indicative of a phase difference between the reference clock signal and a feedback signal based on the output clock signal. To reactivate the phase-locking mode, the phase-locked loop circuit is further configured to enable the feedback loop and vary, over a given period of time, the gain value for the loop filter circuit.

In some embodiments, the phase-locked loop circuit includes a frequency divider circuit configured to generate a feedback signal using the output clock signal. To activate the frequency acquisition mode, the phase-locked loop circuit is further configured to reset the frequency divider circuit. In other embodiments, the frequency of the second clock signal periodically varies from a first frequency value to a second frequency value.

Figure 11:
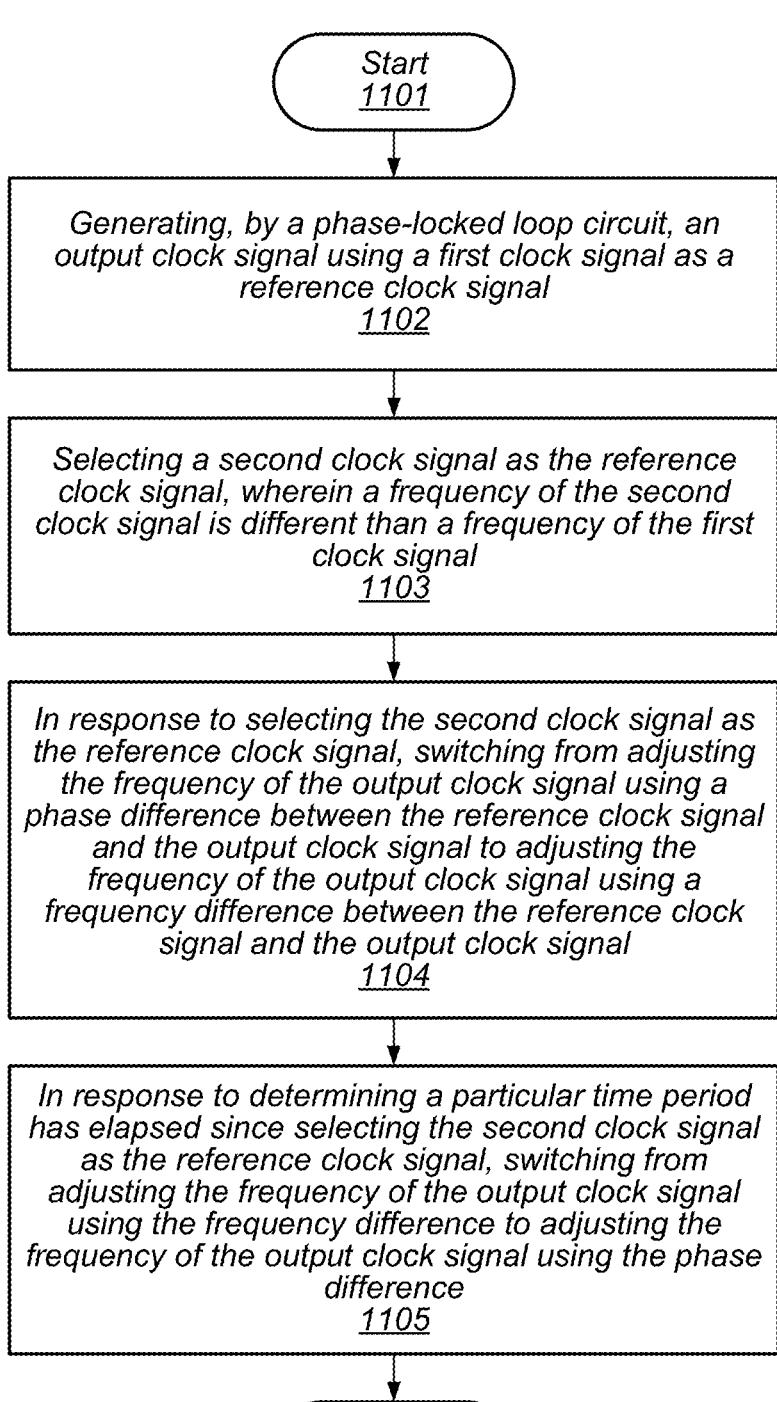
FIG. 11 illustrates a flow diagram depicting an embodiment of a method for switching reference clocks for a phase-locked loop circuit.

Turning to FIG. 11, a flow diagram depicting an embodiment of a method for operating a clock generator circuit is illustrated. The method, which may be applied to various clock generator circuits including clock generator circuit 100, begins in block 1101.

The method includes generating, by a phase-locked loop circuit, an output clock signal using a first clock signal as reference clock signal (block 1102). In some embodiments, the method may include generating the first clock signal by a crystal oscillator circuit, and generating a second clock signal by a clock-data recovery circuit using a plurality of signals that encode a serial data stream that includes a plurality of symbols.

The method further includes selecting the second clock signal as the reference clock signal (block 1103). In various embodiments, a frequency of the second clock signal is different than a frequency of the first clock signal. In other embodiments, the frequency of the second clock signal periodically varies from a first frequency value to a second frequency value.

In other embodiments, the method may further include generating, using a control signal, the output clock signal by a digitally controlled oscillator circuit included in the phase-locked loop circuit, and generating the control signal using settings indicative of the frequency of the second clock signal in response to switching to adjusting the frequency of the output clock signal using the frequency of the reference clock signal.

The method also includes, in response to selecting the second clock signal as the reference clock signal, switching from adjusting the frequency of the output clock signal using a phase difference between the reference clock signal and the output clock signal to adjusting the frequency of the output clock signal using a difference between the frequency of the reference clock signal and the frequency of the output clock signal (block 1104).

The method further includes, in response to determining a particular time period has elapsed since selecting the second clock signal as the reference clock signal, switching from adjusting the frequency of the output clock signal using the frequency difference to adjusting the frequency of the output clock signal using the phase difference (block 1105).

In some embodiments, the method may also include generating an error signal based on the phase difference between the reference clock signal and the output clock signal and filtering, using a gain value, the error signal to generate a filtered signal. In such cases, the method may further include generating the control signal using the filtered signal, and varying, over a given period of time, the gain value in response to switching to adjusting the frequency of the output clock signal using the phase difference. The method concludes in block 1106.

Figure 12:
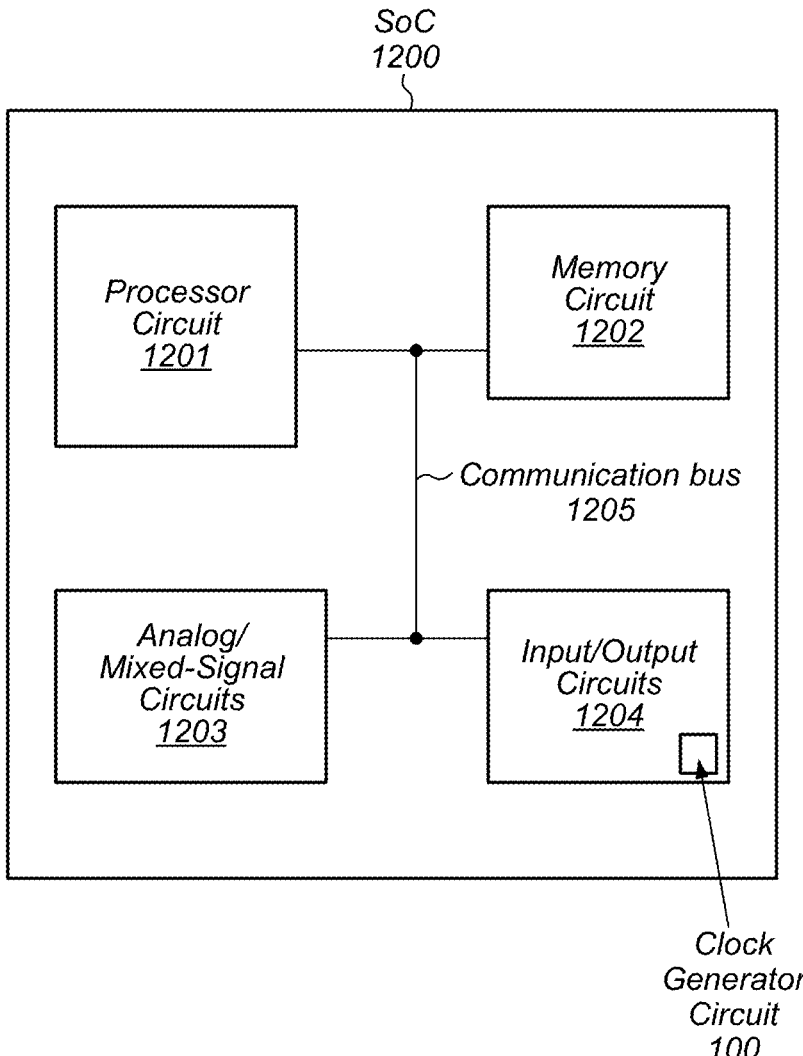
FIG. 12 is a block diagram of an embodiment of a system-on-a-chip that includes a clock generation circuit.

A block diagram of a system-on-a-chip (SoC) is illustrated in FIG. 12. As illustrated, the SoC 1200 includes processor circuit 1201, memory circuit 1202, analog/mixed-signal circuits 1203, and input/output circuits 1204, each of which is coupled to communication bus 1205. In various embodiments, SoC 1200 may be configured for use in a desktop computer, server, or in a mobile computing application such as a tablet, laptop computer, or wearable computing device.

Processor circuit 1201 may, in various embodiments, be representative of a general-purpose processor that performs computational operations. For example, processor circuit 1201 may be a central processing unit (CPU), a graphics processing unit (GPU), a microcontroller, or the like, and may be implemented as an application-specific integrated circuit (ASIC), a field-programmable gate array (FPGA), etc. In some embodiments, processor circuit 1201 may interface to memory circuit 1202, analog/mixed-signal circuits 1203, and input/output circuits 1204 via communication bus 1205.

Memory circuit 1202 may, in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 12, a single memory circuit is depicted. In other embodiments, any suitable number of memory circuits may be employed.

Analog/mixed-signal circuits 1203 may include a crystal oscillator circuit, an analog-to-digital converter (ADC) circuit, and a digital-to-analog converter (DAC) circuit (all not shown). In other embodiments, analog/mixed-signal circuits 1203 may be configured to perform power management tasks with the inclusion of on-chip power supplies and voltage regulators.

Input/output circuits 1204 may include clock generator circuit 100 and may be configured to coordinate data transfer between SoC 1200 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1204 may be configured to implement a version of Universal Serial Bus (USB) protocol or IEEE 1394 (Firewire®) protocol.

Input/output circuits 1204 may also be configured to coordinate data transfer between SoC 1200 and one or more devices (e.g., other computing systems or integrated circuits) coupled to SoC 1200 via a network. In one embodiment, input/output circuits 1204 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1204 may be configured to implement multiple discrete network interface ports.

Figure 13:
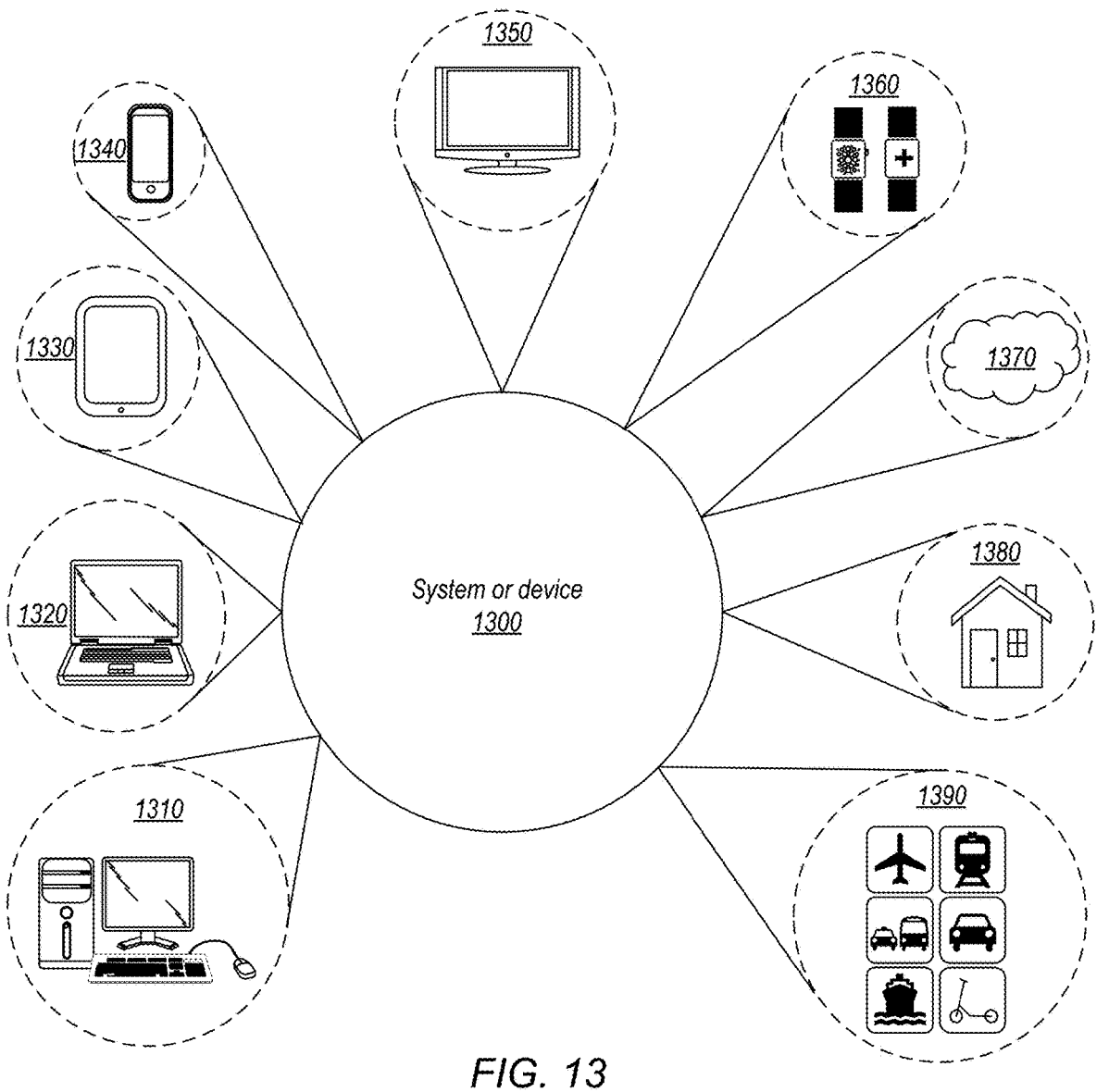
FIG. 13 is a block diagram of a computer system.

Turning now to FIG. 13, various types of systems that may include any of the circuits, devices, or system discussed above are illustrated. System or device 1300, which may incorporate or otherwise utilize one or more of the techniques described herein, may be utilized in a wide range of areas. For example, system or device 1300 may be utilized as part of the hardware of systems such as a desktop computer 1310, laptop computer 1320, tablet computer 1330, cellular or mobile phone 1340, or television 1350 (or set-top box coupled to a television).

Similarly, disclosed elements may be utilized in a wearable device 1360, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1300 may also be used in various other contexts. For example, system or device 1300 may be utilized in the context of a server computer system, such as a dedicated server or on shared hardware that implements a cloud-based service 1370. Still further, system or device 1300 may be implemented in a wide range of specialized everyday devices, including devices 1380 commonly found in the home such as refrigerators, thermostats, security cameras, etc. The interconnection of such devices is often referred to as the "Internet of Things" (IoT). Elements may also be implemented in various modes of transportation. For example, system or device 1300 could be employed in the control systems, guidance systems, entertainment systems, etc. of various types of vehicles 1390.

The applications illustrated in FIG. 13 are merely exemplary and are not intended to limit the potential future applications of disclosed systems or devices. Other example applications include, without limitation: portable gaming devices, music players, data storage devices, unmanned aerial vehicles, etc.

Figure 14:
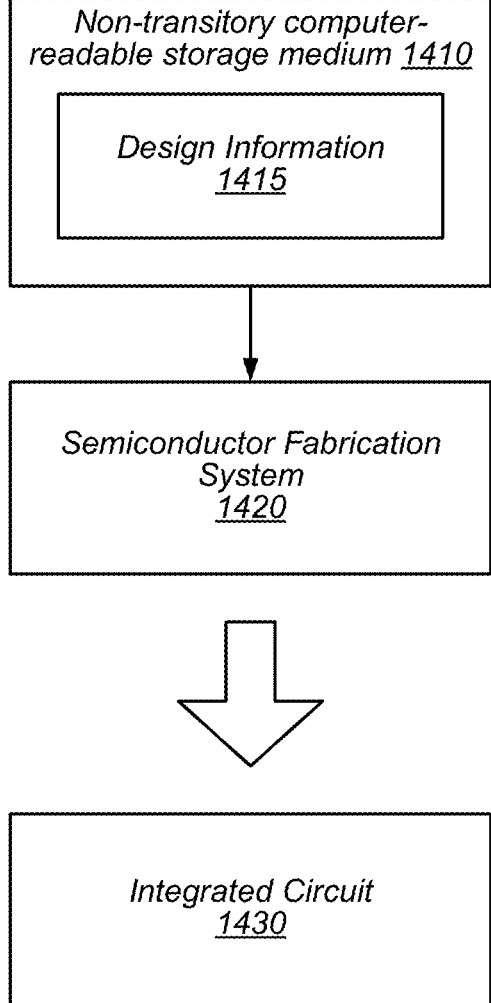
FIG. 14 illustrates an example of a non-transitory computer-readable storage medium that stores circuit design information.

FIG. 14 is a block diagram illustrating an example of a non-transitory computer-readable storage medium that stores circuit design information, according to some embodiments. In the illustrated embodiment, semiconductor fabrication system 1420 is configured to process design information 1415 stored on non-transitory computer-readable storage medium 1410 and fabricate integrated circuit 1430 based on design information 1415.

Non-transitory computer-readable storage medium 1410 may comprise any of various appropriate types of memory devices or storage devices. Non-transitory computer-readable storage medium 1410 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 1410 may include other types of non-transitory memory as well or combinations thereof. Non-transitory computer-readable storage medium 1410 may include two or more memory mediums, which may reside in different locations, e.g., in different computer systems that are connected over a network.

Design information 1415 may be specified using any of various appropriate computer languages, including hardware description languages such as, without limitation: VHDL, Verilog, SystemC, SystemVerilog, RHDL, M, MyHDL, etc. Design information 1415 may be usable by semiconductor fabrication system 1420 to fabricate at least a portion of integrated circuit 1430. The format of design information 1415 may be recognized by at least one semiconductor fabrication system, such as semiconductor fabrication system 1420, for example. In some embodiments, design information 1415 may include a netlist that specifies elements of a cell library, as well as their connectivity. One or more cell libraries used during logic synthesis of circuits included in integrated circuit 1430 may also be included in design information 1415. Such cell libraries may include information indicative of device or transistor level netlists, mask design data, characterization data, and the like, of cells included in the cell library.

Integrated circuit 1430 may, in various embodiments, include one or more custom macrocells, such as memories, analog or mixed-signal circuits, and the like. In such cases, design information 1415 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1420 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1420 may also be configured to perform various testing of fabricated circuits for correct operation.

In various embodiments, integrated circuit 1430 is configured to operate according to a circuit design specified by design information 1415, which may include performing any of the functionality described herein. For example, integrated circuit 1430 may include any of various elements shown or described herein. Further, integrated circuit 1430 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of elements. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:

a multiplex circuit configured to generate a reference clock signal based on a first clock signal or based on a second clock signal; and a clock generator circuit configured to:

generate, from the reference clock signal, an output clock signal using a phase-locking mode;

receive an indication that the multiplex circuit has transitioned from generating the reference clock signal based on the first clock signal to generating the reference clock signal based on the second clock signal; and in response to the indication, transition from using the phase-locking mode to using a frequency acquisition mode in which the clock generator circuit is configured to adjust a frequency of the output clock signal based on a frequency difference between the reference clock signal and the output clock signal.

2. The apparatus of claim 1, wherein the indication includes a reference switch signal, and wherein, in response to activation of the reference switch signal, the multiplex circuit is configured to generate the reference clock signal based on the second clock signal.

3. The apparatus of claim 1, wherein, in the phase-locking mode, the clock generator circuit is configured to adjust a phase of the output clock signal based on a phase difference between the reference clock signal and the output clock signal, and wherein the clock generator circuit includes a phase-locked loop circuit.

4. The apparatus of claim 1, wherein the clock generator circuit includes:

a loop filter circuit configured to generate a phase mode signal, wherein, to generate the phase mode signal, the loop filter circuit is configured to scale an error signal by a phase gain signal;

a frequency acquisition circuit configured to generate a frequency mode signal based on a count signal, the reference clock signal, and a frequency acquisition gain signal;

a second multiplex circuit configured to generate a control signal based on the frequency mode signal in response to the indication; and an oscillator circuit configured to generate the output clock signal based on the control signal.

5. The apparatus of claim 4, further comprising:

a feedback circuit configured to generate a feedback signal based on the output clock signal in the phase-locking mode or to generate the count signal based on the output clock signal in the frequency acquisition mode.

6. The apparatus of claim 5, wherein a value of the count signal indicates a frequency of the output clock signal.

7. The apparatus of claim 4, further comprising:

a loop control circuit configured to generate the phase gain signal based on the indication, wherein, in response to receipt of the indication, the multiplex circuit is configured to generate the reference clock signal based on the second clock signal.

8. The apparatus of claim 7, wherein the loop control circuit includes:

a logic circuit configured to generate a selection signal, a reset signal, a frequency trigger signal, and a phase trigger signal based on the indication;

a frequency lock mode selector circuit configured to generate the frequency acquisition gain signal based on the frequency trigger signal; and a phase lock mode selector circuit configured to generate the phase gain signal based on the phase trigger signal.

9. The apparatus of claim 8, wherein the clock generator circuit is configured to transition from the frequency acquisition mode to the phase-locking mode, and wherein, to transition from the frequency acquisition mode to the phase-locking mode, the clock generator circuit is configured to vary the phase gain signal from a high-bandwidth value to a low-bandwidth value.

10. A method, comprising:

generating, by a multiplex circuit, a reference clock signal based on a first clock signal or based on a second clock signal;

generating, by a clock generator circuit from the reference clock signal, an output clock signal using a phase-locking mode;

receiving, by the clock generator circuit, an indication that the multiplex circuit has transitioned from generating the reference clock signal based on the first clock signal to generating the reference clock signal based on the second clock signal; and in response to the indication, transitioning, by the clock generator circuit, from using the phase-locking mode to using a frequency acquisition mode; and adjusting, by the clock generator circuit, a frequency of the output clock signal based on a frequency difference between the reference clock signal and the output clock signal, the clock generator circuit being in the frequency acquisition mode.

11. The method of claim 10, wherein the indication includes a reference switch signal, and wherein, in response to activation of the reference switch signal, generating, by the multiplex circuit, the reference clock signal based on the second clock signal.

12. The method of claim 10, further comprising:

adjusting, by the clock generator circuit, the frequency of the output clock signal based on a phase difference between the reference clock signal and the output clock signal, the clock generator circuit being in the phase-locking mode from the frequency acquisition mode.

13. The method of claim 10, further comprising:

generating, by a loop filter circuit of the clock generator circuit, a phase mode signal, wherein generating the phase mode signal includes scaling an error signal by a phase gain signal;

generating, by a frequency acquisition circuit of the clock generator circuit, a frequency mode signal based on a count signal, the reference clock signal, and a frequency acquisition gain signal;

generating, by a second multiplex circuit of the clock generator circuit, a control signal based on the frequency mode signal in response to activation of a selection signal in the frequency acquisition mode or based on the phase mode signal in the phase-locking mode; and generating, by an oscillator circuit of the clock generator circuit, the output clock signal based on the control signal.

14. The method of claim 13, further comprising:

generating, by a feedback circuit, a feedback signal based on the output clock signal in the phase-locking mode or generating the count signal based on the output clock signal in the frequency acquisition mode.

15. The method of claim 14, wherein a value of the count signal indicates a frequency of the output clock signal.

16. An apparatus, comprising:

a first device that includes a transmitter circuit, the transmitter circuit configured to transmit one or more signals via a communication link; and a second device that includes a receiver circuit, the receiver circuit configured to receive the one or more signals via the communication link, wherein the receiver circuit includes:

a multiplex circuit configured to generate a reference clock signal based on a first clock signal or based on a second clock signal; and a clock generator circuit configured to:

generate, from the reference clock signal, an output clock signal using a phase-locking mode;

receive an indication that the multiplex circuit has transitioned from generating the reference clock signal based on the first clock signal to generating the reference clock signal based on the second clock signal; and in response to the indication, transition from using the phase-locking mode to using a frequency acquisition mode in which the clock generator circuit is configured to adjust a frequency of the output clock signal based on a frequency difference between the reference clock signal and the output clock signal.

17. The apparatus of claim 16, wherein the indication includes a reference switch signal, and wherein, in response to activation of the reference switch signal, the multiplex circuit is configured to generate the reference clock signal based on the second clock signal.

18. The apparatus of claim 17, wherein, in the phase-locking mode, the clock generator circuit is configured to adjust the frequency of the output clock signal based on a phase difference between the reference clock signal and the output clock signal, and wherein the clock generator circuit includes a phase-locked loop circuit.

19. The apparatus of claim 16, wherein the clock generator circuit includes:

a loop filter circuit configured to generate a phase mode signal, wherein, to generate the phase mode signal, the loop filter circuit is configured to scale an error signal by a phase gain signal;

a frequency acquisition circuit configured to generate a frequency mode signal based on a count signal, the reference clock signal, and a frequency acquisition gain signal;

a second multiplex circuit configured to generate a control signal based on the frequency mode signal in response to the indication; and an oscillator circuit configured to generate the output clock signal based on the control signal.

20. The apparatus of claim 19, further comprising a feedback circuit configured to generate a feedback signal based on the output clock signal in the phase-locking mode or to generate the count signal based on the output clock signal in the frequency acquisition mode.

\*  \*  \*  \*  \*